United States Patent
Melik-Martirosian et al.

(10) Patent No.: US 8,364,888 B2
(45) Date of Patent: Jan. 29, 2013

(54) ERASE-SUSPEND SYSTEM AND METHOD

(75) Inventors: Ashot Melik-Martirosian, San Diego, CA (US); Pablo Alejandro Ziperovich, San Diego, CA (US); Mark Moshayedi, Newport Coast, CA (US)

(73) Assignee: STEC, Inc., Santa Ana, CA (US)

( * ) Notice: Subject to any disclaimer, the term of this patent is extended or adjusted under 35 U.S.C. 154(b) by 0 days.

(21) Appl. No.: 13/365,232

(22) Filed: Feb. 2, 2012

(65) Prior Publication Data

US 2012/0254515 A1 Oct. 4, 2012

Related U.S. Application Data

(60) Provisional application No. 61/439,296, filed on Feb. 3, 2011.

(51) Int. Cl.
*G06F 12/00* (2006.01)
*G11C 16/16* (2006.01)
(52) U.S. Cl. ............... 711/103; 365/185.19; 365/185.24
(58) Field of Classification Search .................. None
See application file for complete search history.

(56) References Cited

U.S. PATENT DOCUMENTS

| | | | |
|---|---|---|---|
| 6,279,070 B1* | 8/2001 | Jeong et al. | 711/103 |
| 6,412,041 B1* | 6/2002 | Lee | 711/103 |
| 2003/0095439 A1* | 5/2003 | San et al. | 365/185.22 |
| 2004/0003167 A1* | 1/2004 | Kimura et al. | 711/103 |
| 2007/0239926 A1* | 10/2007 | Gyl et al. | 711/103 |
| 2011/0004726 A1* | 1/2011 | Haukness et al. | 711/103 |
| 2011/0013459 A1* | 1/2011 | Ting et al. | 365/185.19 |

OTHER PUBLICATIONS

"Flash Memory Erase Mode Comparison" by Spansion, Issue Date Aug. 4, 2005, pp. 1-4.*

* cited by examiner

*Primary Examiner* — Kaushikkumar Patel
(74) *Attorney, Agent, or Firm* — McDermott Will & Emery LLP

(57) ABSTRACT

A method for suspending an erase operation performed on a group of memory cells in a flash memory circuit is disclosed. One example method includes providing to the memory circuit a command to erase the group of memory cells via a plurality of erase pulses. After applying an erase pulse, if it is determined that another operation has a priority higher than a predetermined threshold, the method suspends the erase operation, performs the other operation, and then resumes the erase operation.

20 Claims, 6 Drawing Sheets

ERASE-SUSPEND SYSTEM AND METHOD

CROSS-REFERENCES TO RELATED APPLICATIONS

This application claims priority from U.S. Provisional Application No. 61/439,296, filed Feb. 3, 2011, which is incorporated herein by reference in its entirety.

TECHNICAL FIELD

The subject technology generally relates to flash memory devices.

BACKGROUND

Flash memory bears little resemblance to a magnetic recording system. Commodity flash chips are closed systems with no external access to analog signals, in sharp contrast to the typical Hard Disk Drive (HDD) where analog signals have always been available for study. Even though a HDD is a complex electro-mechanical system and can suffer catastrophic failure, it has been possible to engineer drives to have a life expectancy with little to no degradation in performance, which last beyond their time of technical obsolescence. Flash memory, on the other hand, has a finite life expectancy with gradual degradation in performance through the life cycle. Even so, since flash memory was first conceived as a memory device, the target error rate at the output of the chip has been very low, as opposed to systems where stronger error correction coding (ECC) may be used.

Lower priced solid state drives (SSDs) are typically manufactured using multi-level cell (MLC) flash memory for increased data capacity, but MLC may be less reliable than single-level cell (SLC) flash memory. Consumer SSD manufacturers have mitigated such problems by employing interleaving, special writing algorithms, and/or providing excess capacity in conjunction with wear-leveling algorithms. MLC flash life span (for example, a total number of programming/erase cycles before producing an unacceptable error rate), however, may be sacrificed to meet the requirements of mainstream consumer flash applications, which require flash to have low cost, long retention time, fast programming/erase, and low overall error rate to work with unsophisticated controllers, and, consequently, has not been proven acceptable for many enterprise SSD applications. Even with the increased data capacity of MLC, it may be more expensive to use in enterprise applications because of its disproportionately large reduction in cycle endurance due to increased (wear causing) stresses that are required to read, program, and erase the flash.

SUMMARY

A method for suspending an erase operation performed on a group of memory cells in a flash memory circuit is disclosed. In one aspect, the method may include initiating an erase operation on a group of memory cells, the erase operation including a plurality of erase pulses, after a number of erase pulses, determining that a subsequent operation is ready to be performed, suspending the erase operation, performing the subsequent operation, and resuming the erase operation. In certain aspects, the determining that the subsequent operation is ready to be performed may include determining the subsequent operation has a higher priority than the erase operation. Other aspects include corresponding systems, apparatus, and computer program products for implementation of the computer-implemented method.

In another aspect, a machine-readable medium may include instructions stored thereon that, when executed by a processor, perform a method for suspending a flash memory erase operation. In this regard, the method may include providing to a flash memory circuit an instruction to erase the group of memory cells using the erase operation, receiving the verify failed status after an erase pulse has been performed and before the group of memory cells have been fully erased, determining that another (subsequent) operation has a priority above a predetermined threshold, suspending the erase operation, performing the subsequent operation, and resuming the erase operation after performing the subsequent operation. Other aspects include corresponding systems, apparatus, and computer program products for implementation of the method.

A system may include a flash memory circuit, including one or more blocks of memory, and a controller operably connected to the flash memory circuit. The controller may be operable to provide to the flash memory circuit an instruction to erase the block of memory cells using the erase operation, receive a first indication that the erase operation is not completed and receive a second the indication that a subsequent operation is ready to be performed. On receiving the second indication, the controller may be operable to suspend the erase operation, perform the subsequent operation, and resume the erase operation. In certain aspects, the subsequent operation has a priority level above a predetermined threshold.

The previously described aspects and other aspects may provide one or more advantages, including, but not limited to, including an algorithm to reduce the blocking time of the erase operation and, thus, improve input-output operations (IOPs) performance of the SSD, and, for the same number of IOPs used in other SSD applications that do not employ the subject technology, reduce the flash memory wear-out and achieve higher number of PR/erase cycles the flash memory can undergo.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

BRIEF DESCRIPTION OF THE DRAWINGS

A detailed description will be made with reference to the accompanying drawings.

DETAILED DESCRIPTION

Figure 1:
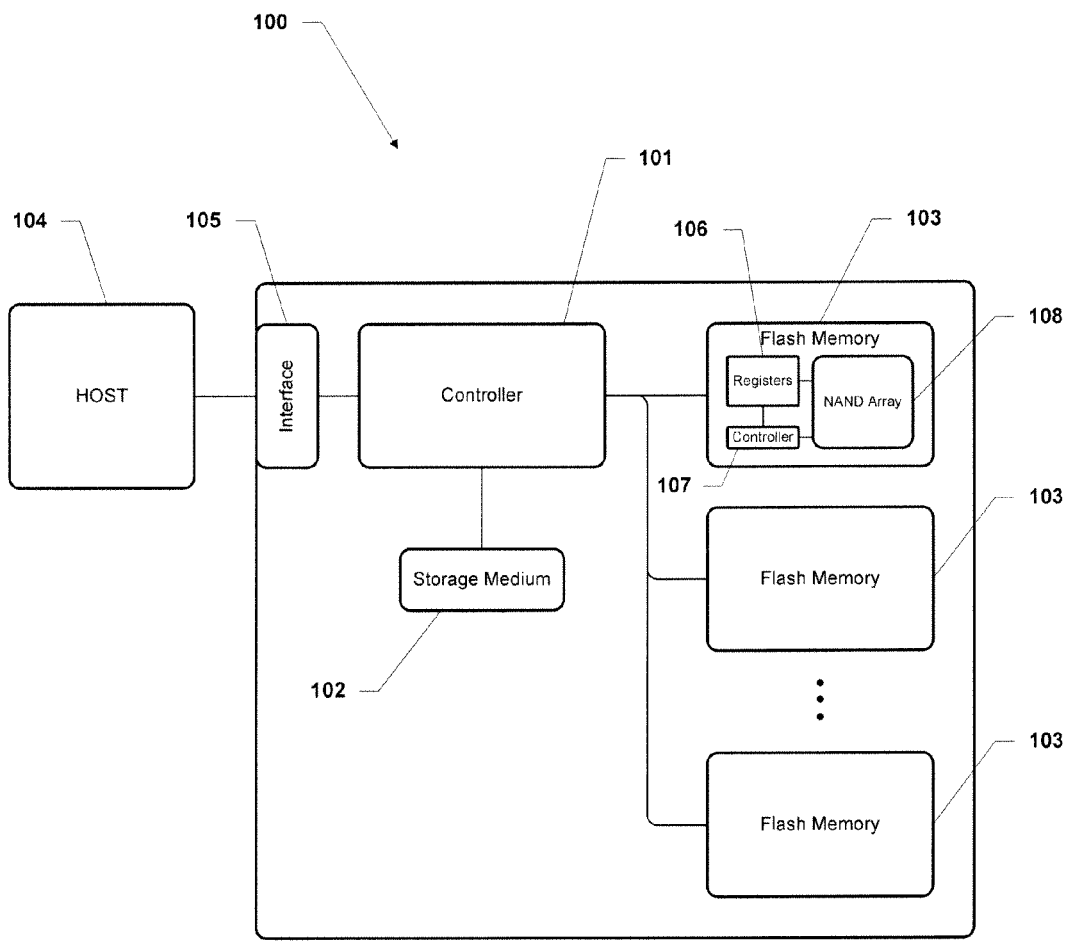
FIG. 1 is a block diagram illustrating example components of a data storage system.

The subject technology provides a system and method for use in flash memory cell architectures that adjust erase conditions to increase the number of operations that may be performed simultaneously on a flash memory device. Using the subject technology, a flash memory device may be reconfigured during the operation of the device to reduce wear and increase performance of the overall SSD system. A number of parameters may be adjusted, including the number of erase pulses used to fully erase programmed memory cells in the flash memory device. During an erase operation, after applying a limited number of erase pulses (for example, one), the subject technology suspends the erase operation and allows other, higher priority, operations to execute. Accordingly, operation throughput is increased and a positive impact on SSD performance is achieved.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be apparent to those skilled in the art that the subject technology may be practiced without these specific details. In some instances, well-known structures and components are shown in block diagram form in order to avoid obscuring the concepts of the subject technology. Like components are labeled with identical element numbers for ease of understanding.

In a flash memory device (for example, with NAND architecture), memory cells are grouped in strings, with each string consisting of a set of transistors connected in series between a drain select transistor, connected to a bit line of the memory block, and a source select transistor, connected to a reference voltage distribution line. Each memory cell may include a floating-gate MOS transistor. When programming a memory cell, electrons are injected into the floating-gate, for example, by means of Fowler-Nordheim (F-N) Tunneling. The non-volatility of the cell may be due to the electrons maintained within the floating-gate. Bits may be stored by trapping charge on the floating gate (an electrically isolated conductor) which stores a logic value defined by its threshold voltage (read threshold) commensurate with the electric charge stored. When the cell is erased, the electrons in the floating gate may be removed by quantum tunneling (a tunnel current) from the floating gate to, for example, the source and/or substrate.

As a flash memory device ages, error rates may increase due to increasingly changing threshold voltage conditions. For example, as flash memory is cycled (that is, programmed and erased repeatedly), its physical qualities may change. In this regard, the repeated placement and removal of electrons to and from the floating gate during programming and erase operations, respectively, may cause some excess electrons to be trapped in the device, or, in some cases, damage to the structure of the device. For example, when one or multiple cells are programmed, adjacent cells may experience an unexpected and undesired charge injection to their floating gates, thus leading to corruption of data stored therein and errors when the data is read. Electrons may eventually leak into neighboring cells after prolonged stress due to the voltages at the gates of neighboring cells. Moreover, the repeated application of a high tunnel current generated during an erase operation may eventually wear down the insulation between the floating gate and the source and/or substrate. This is further aggravated by shorter erase cycles using, for example, a high negative charge. Corruption of data may result from the loss of electrons through weakened insulators during cell idle time.

Adding enough electrons may change a cell from an erased state to a programmed state, or cause a change between programmed states. Similarly, removing electrons may change a cell from a first programmed state to a different programmed state, or to an erased state. Generally, the impact to the threshold voltages of the memory cells may be a function of the field strength (voltage) and duration of charge applied to the cells. That is, programming the flash memory to high threshold voltage conditions may increase the amount of electrons that leak into neighboring cells for both program and erase processes because each cycle requires a longer duration and/or higher applied fields.

Longer erase times have been shown to be beneficial in reducing wear-out/degradation of flash memory gate insulators during cycling, however, at a significant loss to operational efficiency. Contrary to industry practice, the subject technology alleviates this and other problems by providing a mechanism for increasing the number of operations that may be performed on a flash memory device without the need to sacrifice erase time or device life span, and, hence, improves the performance of a SSD that uses the technology. As will be described in further detail, the subject technology may dynamically suspend an erase operation performed on a group of memory cells in a non-volatile memory circuit before the group of memory cells has been fully erased to allow other high priority operations to execute.

FIG. 1 is a block diagram illustrating example components of a data storage system according to one aspect of the subject technology. As depicted in FIG. 1, data storage system 100 (for example, a solid state drive) includes data storage controller 101, storage medium 102, and flash memory 103. Controller 101 may use storage medium 102 for temporary storage of data and information used to manage data storage system 100. Controller 101 may include several internal components (not shown) such as a read-only memory, a flash component interface (for example, a multiplexer to manage instruction and data transport along a serial connection to flash memory 103), an I/O interface, error correction circuitry, and the like. In some aspects, all of these elements of controller 101 may be integrated into a single chip. In other aspects, these elements may be separated on their own PC board.

Controller 101 may also include a processor configured to execute code or instructions to perform the operations and functionality described herein, manage request flow and address mappings, and to perform calculations and generate commands. The processor of controller 101 is configured to monitor and control the operation of the components in data storage controller 101. The processor may be a general-purpose microprocessor, a microcontroller, a digital signal processor (DSP), an application specific integrated circuit (ASIC), a field programmable gate array (FPGA), a programmable logic device (PLD), a controller, a state machine, gated logic, discrete hardware components, or a combination of the foregoing. One or more sequences of instructions may be stored as firmware on ROM within controller 101 and/or its processor. One or more sequences of instructions may be software stored and read from storage medium 102, flash memory 103, or received from host device 104 (for example, via host interface 105). ROM, storage medium 102, flash memory 103, represent examples of machine or computer readable media on which instructions/code executable by controller 101 and/or its processor may be stored. Machine or computer readable media may generally refer to any medium or media used to provide instructions to controller 101 and/or its processor, including both volatile media, such as dynamic memory used for storage media 102 or for buffers within controller 101, and non-volatile media, such as electronic media, optical media, and magnetic media.

In some aspects, controller 101 is configured to store data received from a host device 104 in flash memory 103 in response to a write command from host device 104. Controller 101 is further configured to read data stored in flash memory 103 and to transfer the read data to host device 104 in response to a read command from host device 104. As will be described in more detail below, controller 101 is configured to, on determining certain operating conditions are present, suspend an erase operation performed on a block and/or page of memory. By dynamically and selectively suspending erase operations performed on flash memory 103, the subject technology may improve SSD performance and reduce flash memory wear compared to performance of SSD using flash memory cells in the same application environment without the ability to dynamically suspend erase operations.

Host device 104 represents any device configured to be coupled to data storage system 100 and to store data in data storage system 100. Host device 104 may be a computing system such as a personal computer, a server, a workstation, a laptop computer, PDA, smart phone, and the like. Alternatively, host device 104 may be an electronic device such as a digital camera, a digital audio player, a digital video recorder, and the like.

In some aspects, storage medium 102 represents volatile memory used to temporarily store data and information used to manage data storage system 100. According to one aspect of the subject technology, storage medium 102 is random access memory (RAM) such as double data rate (DDR) RAM. Other types of RAM also may be used to implement storage medium 102. Memory 102 may be implemented using a single RAM module or multiple RAM modules. While storage medium 102 is depicted as being distinct from controller 101, those skilled in the art will recognize that storage medium 102 may be incorporated into controller 101 without departing from the scope of the subject technology. Alternatively, storage medium 102 may be a non-volatile memory such as a magnetic disk, flash memory, peripheral SSD, and the like.

As further depicted in FIG. 1, data storage system 100 may also include host interface 105. Host interface 105 is configured to be coupled to host device 104, to receive data from host device 104 and to send data to host device 104. Host interface 105 may include both electrical and physical connections for operably coupling host device 104 to controller 101, for example, via the I/O interface of controller 101. Host interface 105 is configured to communicate data, addresses, and control signals between host device 104 and controller 101. Alternatively, the I/O interface of controller 101 may include and/or be combined with host interface 105. Host interface 105 may be configured to implement a standard interface, such as Serial-Attached SCSI (SAS), Fiber Channel interface, PCI Express (PCIe), SATA, USB, and the like. Host interface 105 may be configured to implement only one interface. Alternatively, host interface 105 (and/or the I/O interface of controller 101) may be configured to implement multiple interfaces, which are individually selectable using a configuration parameter selected by a user or programmed at the time of assembly. Host interface 105 may include one or more buffers for buffering transmissions between host device 104 and controller 101.

Flash memory 103 represents a non-volatile memory device for storing data. According to one aspect of the subject technology, flash memory 103 includes, for example, a NAND flash memory. Flash memory 103 may include a single flash memory device or chip, or, as depicted by FIG. 1, may include multiple flash memory devices or chips arranged in multiple channels. Flash memory 103 is not limited to any particular capacity or configuration. For example, the number of physical blocks, the number of physical pages per physical block, the number of sectors per physical page, and the size of the sectors may vary within the scope of the subject technology.

Flash memory may have a standard interface specification. This standard ensures that chips from multiple manufacturers can be used interchangeably (at least to a large degree). The interface may further hide the inner working of the flash memory and return only internally detected bit values for data. The interface of flash memory 103 may be used to access one or more internal registers 106 and an internal flash controller 107. In some aspects, registers 106 may include address, command, control, and/or data registers, which internally retrieve and output the necessary data to and from a NAND memory cell array 108. For example, a data register may include data to be stored in memory array 108, or data after a fetch from memory array 108, and may also be used for temporary data storage and/or act like a buffer. An address register may store the memory address from which data will be fetched to host 104 or the address to which data will be sent and stored. In some aspects, a command register may be included to control parity, interrupt control, and/or the like. In some aspects, internal flash controller 107 is accessible via a control register to control the general behavior of flash memory 103. Internal flash controller 107 and/or the control register may control the number of stop bits, word length, receiver clock source, and may also control switching the addressing mode, paging control, coprocessor control, and the like.

In some aspects, registers 106 may include a test register. The test register may, for example, be accessed by specific addresses and/or data combinations provided at the interface of flash memory 103 (for example, by specialized software provided by the manufacturer to perform various tests on the internal components of the flash memory). The test register may be used to access and/or modify other internal registers, for example, the command and/or control registers. In some aspects, test modes accessible via the test register may be used to input or modify certain programming conditions of flash memory 103 (for example, erase parameters) to dynamically vary how data is programmed or erased from the memory cells of memory arrays 108.

Figure 2:
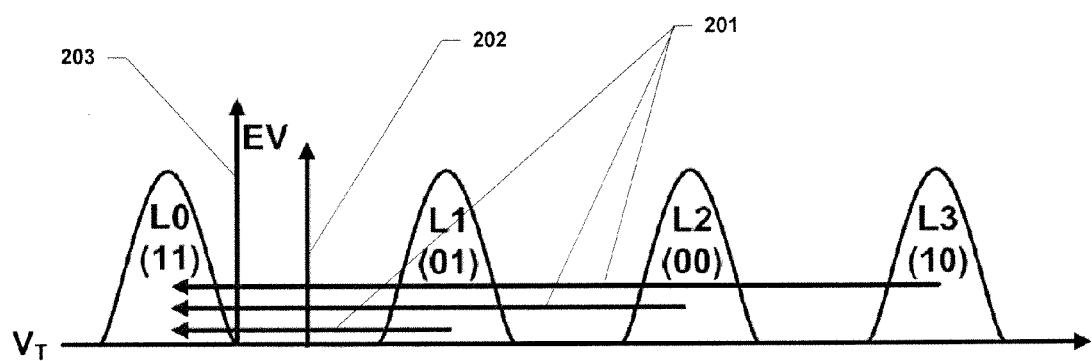
FIG. 2 is a graph diagram illustrating example voltage evolutions of four possible distributions of memory cells in a MLC flash memory cell during an erase operation.

FIG. 2 is a graph diagram illustrating example voltage evolutions of four possible distributions of memory cells in a MLC flash memory cell during an erase operation according to one aspect of the subject technology. A MLC cell (for example, a 2-bit NAND cell) may be programmed to one of four levels: an erased level, and three programmed levels. After one or more programming cycles, each group of cells programmed to a respective level may yield a distribution of cells (for example, about the programmed level). Accordingly, each group of cells may form a L0 distribution state (for example, binary 11), L1 distribution state (binary 01), L2 distribution state (binary 00), or L3 distribution state (binary 10).

In some aspects, a memory block may be programmed one page at a time using an Incremental Step Pulse Program (ISSP) and erased using a similar Incremental Step Pulse Erase Erase (ISPE). The ISPP and/or ISPE may be performed by flash controller 107 in response to one or more instructions (for example, commands) received from controller 101. For example, using an ISPP, a page operation may be performed by applying a voltage at the gates of each cell in the memory page. A corresponding selection at the bit lines creates a voltage potential in the selected group of memory cells to create one or more distributions that are different than the erased L0 distribution state (for example, binary 11).

During an Erase operation in 1-bit/cell (SLC) or 2-bit/cell (MLC) NAND flash memory, memory cells are returned to the erased state. In this regard, flash memory 103 may be instructed by controller 101 to perform an Incremental Step Pulse Erase (ISPE) procedure to apply a series of voltage pulses to the memory cells which are being erased. The amplitude polarity may be reversed (from ISPP) during the erase operation to remove electrons from the floating gates of the memory cells. The voltage evolution of such an erase operation is depicted in FIG. 2 by the arrows 201 representing cells of the L1 distribution, L2 distribution, and L3 distribution being returned to the L0 distribution state, with each cell falling below a threshold voltage 202 corresponding to an erased state (for example, zero volts). In some aspects, the status of the cells may be verified by applying an erase verify (EV) voltage 203 (for example, at a second threshold voltage) to confirm that the cells have indeed been erased.

Figure 3:
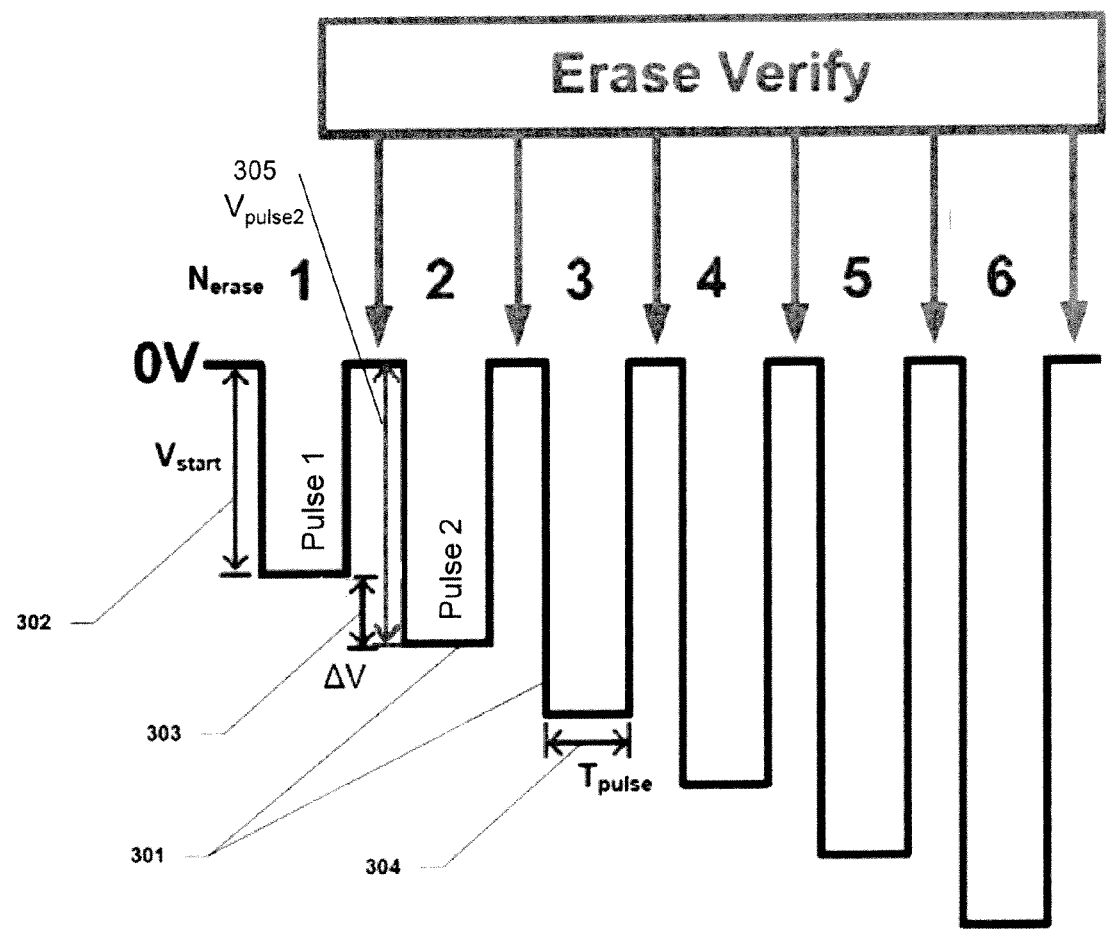
FIG. 3 is a graph diagram illustrating an example erase operation procedure flow and erase parameters.

FIG. 3 is a graph diagram illustrating an example erase operation procedure flow and erase parameters according to one aspect of the subject technology. An erase operation may include a series of voltage pulses 301 that are applied in a step pattern with the amplitude of each pulse incrementally increased with increasing pulse number ($N_{erase}$), starting from a starting pulse voltage ($V_{start}$) 302. Controller 101 may be configured to provide to flash memory 103 (for example, by setting one or more registers 106) one or more erase parameters to use in generating one or more of the erase pulses, including, for example, starting pulse voltage ($V_{start}$) 302, an amplitude increment ($\Delta V$) 303, a pulse width ($T_{pulse}$) 304, time between pulses, and the like. The erase parameters (some of which are depicted in FIG. 3), such as starting erase voltage $V_{start}$, voltage amplitude increment $\Delta V$, current erase pulse number $N_{erase}$, erase pulse width $T_{pulse}$, and maximum allowed number of erase pulses $N_{max}$, may be stored in several registers inside the NAND flash chip. In some aspects, the erase parameters may be defined separately for each pulse or series of pulses. Given a manufacturer's specification for a particular type of flash memory it will be recognizable how to select the appropriate parameters as input to an ISPE to achieve an erased distribution (for example, L0) from a selected higher distribution (for example, L1, L2, or L3).

Figure 4:
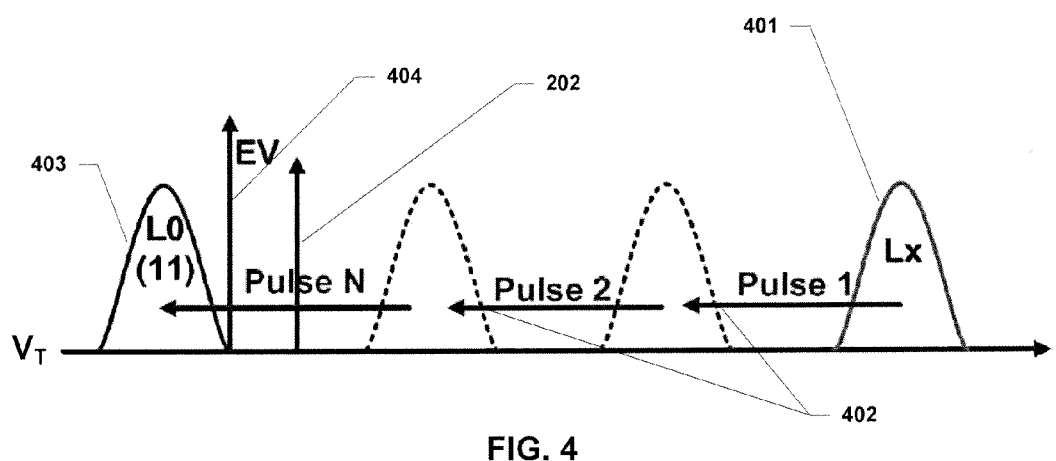
FIG. 4 is a graph diagram illustrating an example pulse-by-pulse shift of a programmed threshold voltage distribution during the application of an example Incremental Step Pulse Erase (ISPE) procedure.

FIG. 4 is a graph diagram illustrating an example pulse-by-pulse shift of a programmed threshold voltage distribution during the application of an example ISPE procedure according to one aspect of the subject technology. During SSD operation, controller 101 may instruct flash controller 107 to issue an erase command for a given memory block to start the ISPE procedure. Flash memory 103 may, as part of the ISPE, apply a number of erase pulses (for example, pulse 1 to pulse N) to the memory cells of the block. During the application of the ISPE procedure, a programmed threshold voltage distribution (Lx) 401 may be gradually shifted 402 to the left (to a lower value) with each pulse, until all of the cells in a block are sufficiently erased to populate the L0 distribution state 403, that is, have their threshold voltages below a predetermined erase verify (EV) level 404. At the conclusion of the ISPE procedure, flash memory 103 may return a "Pass" status, indicating that the erase operation is complete, or a "Fail" status, indicating that erase failed.

In some aspects, the pulse width, $T_{pulse}$, for an individual ISPE erase pulse may be on the order of 0.5 to 1.0 ms, and, the duration of the erase-verify operation may be on the order of 200 µs. Consequently, the total time required to perform a block erase operation may be on the order of 2.5 to 10 ms (for example, with an application of 5 to 20 erase pulses). While one block on a given flash memory die is being erased, another program, erase, or a read operation may be prohibited from being performed on another block on that or a different flash memory die. Since other operations are blocked during the 2.5 to 10 ms required to complete the current erase operation, the erase operation may be seen as a blocking operation. This blocking property of the erase operation may reduce the overall number of Input-Output Operations (IOPs) that can be performed on a die during a predetermined period of time, and hence, negatively impact the performance of the SSD.

A longer, milder erase operation may be performed using more erase pulses (for example, over 10 pulses), smaller negative voltage amplitude, and/or a longer pulse width to reduce the wear-out/degradation of the flash memory cells during cycling. The longer the time required for an erase operation, however, the greater the possibility of a negative impact on SSD performance, for example, in operation or data throughput. Consequently, the blocking property of a longer, milder erase operation may worsen performance to a point where the negative impact on performance outweighs the intended benefit of the operation to reduce wear-out/degradation of the flash memory. The subject technology alleviates these problems by providing a mechanism to suspend an erase operation after one or more pulses, and briefly pass control to other operations. In this regard, by allowing other, higher priority, operations to be completed during a longer, milder erase operation, the subject technology may facilitate a reduction of wear-out/degradation of the flash memory cells while increasing operation throughput and providing a positive impact on SSD performance.

Figure 5:
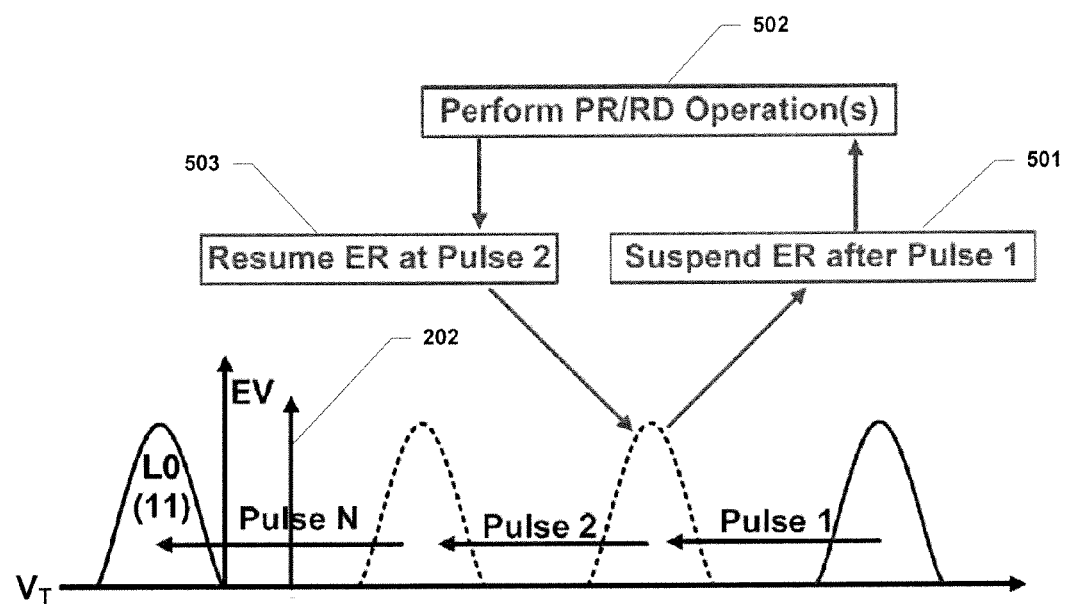
FIG. 5 is a graph diagram illustrating an example method of suspending an erase operation after a first erase pulse.

FIG. 5 is a graph diagram illustrating an example method of suspending an erase operation after a first erase pulse according to one aspect of the subject technology. Controller 101 may be operable (for example, by execution of an algorithm) to program and/or send commands to flash memory 103 to perform the erase operation on a block of memory cells one-pulse-at-a-time (with a verify operation after every pulse); that is, the maximum allowed number of erase pulses $N_{max}$ is equal to 1, contrary to other ISPE procedures, which may apply all of the erase pulses until all of the cells in the block are erased, In the depicted example, the erase (ER) operation may be suspended 501 after Pulse 1. One or more other operations (for example, one or more higher priority program (PR), erase (ER), or a read (RD) operations) are then performed 502 on one or more other blocks or pages of one or more flash memory devices in data storage system 100 while the erase operation is suspended. After the one or more other operations are performed, controller 101 may resume 503 the original erase (ER) operation at Pulse 2. Controller 101 may, for example, provide an instruction to flash memory 103 instructing it to continue erasing the block of memory cells. Erase procedure parameters, including, the starting erase voltage, $V_{start}$, the voltage amplitude increment, $\Delta V$, erase pulse number, $N_{erase}$, and the erase pulse width, $T_{pulse}$, may be stored in storage medium 102 and/or flash memory 103 by the controller 101, and recalled and set prior to resuming the original erase operation. In some aspects, these parameters may also be stored in registers 106 inside flash memory 103.

Figure 6:
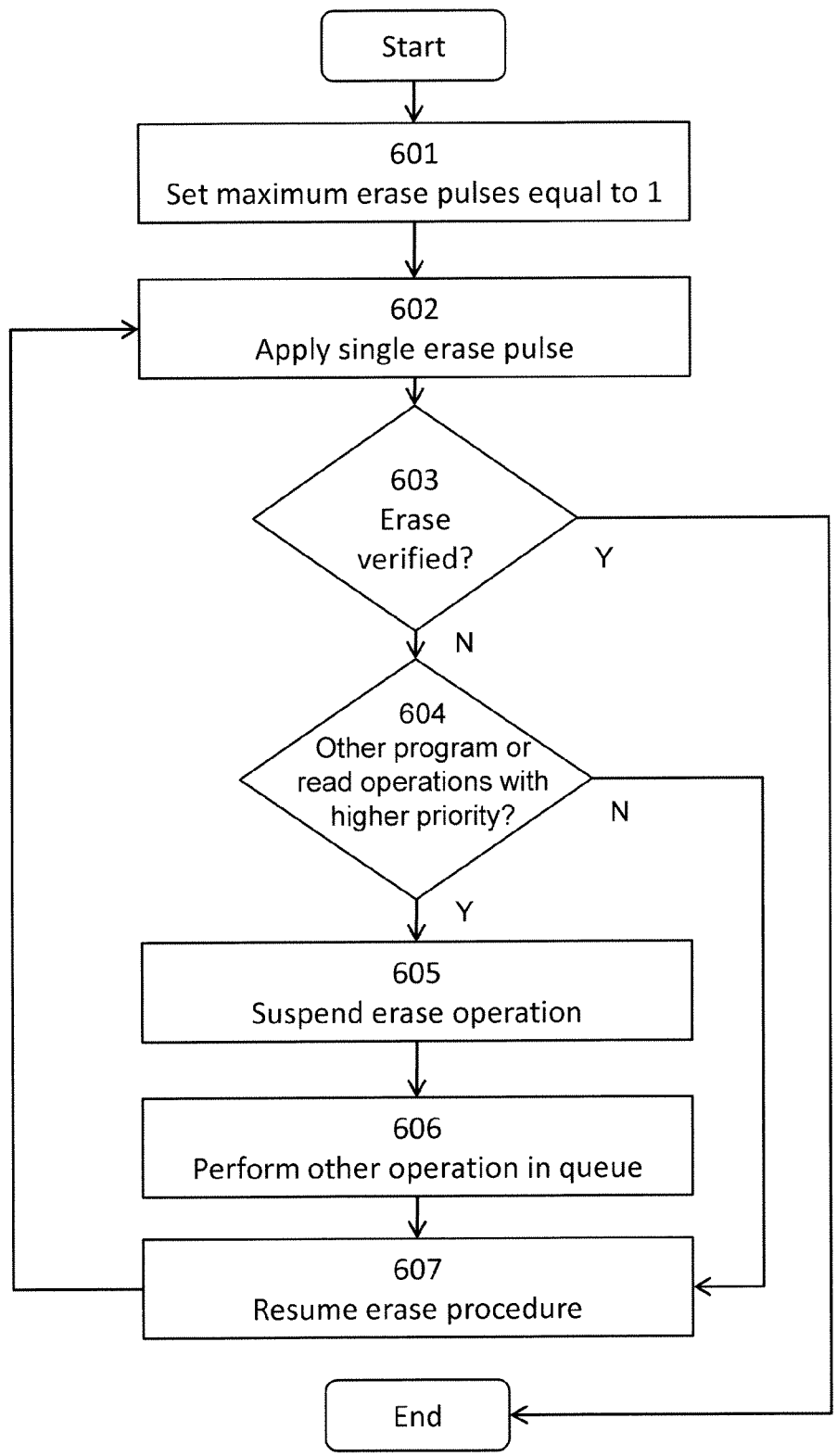
FIG. 6 is a flowchart illustrating an example method for suspending an erase operation performed on a group of memory cells.

FIG. 6 is a flowchart illustrating an example method for suspending an erase operation performed on a group of memory cells according to one aspect of the subject technology. In step 601, controller 101 sets a maximum allowed number of erase pulses, $N_{max}$, to 1 and stores $N_{max}$ in an appropriate register 106 inside the flash memory 103. In step 602, a single erase pulse is applied (for example, by controller 107 of flash memory 103) to the block and/or page being erased. In step 603, controller 101 determines whether the block and/or page is fully erased. Setting $N_{max}$ to 1 programs flash memory 103 to return a "Fail" status to controller 101 after applying a single erase pulse, unless the block is fully erased. If the erase is complete then the process ends. Otherwise, the process proceeds to step 604. As described previously, some block ISPE operations may require application of a plurality of pulses (5 to 20 erase pulses, for example.) In some aspects, data storage system 100 may store a command queue in storage medium 102 for maintaining pending program and/or read operations and a priority value for each operation.

In step 604, after the flash chip is partially erased and returns a "Fail" status after Pulse 1 is applied, the controller 101 may be operable to perform checks (for example, against the command queue) to determine if there are other program or read operations (or another erase operation) with higher priority that are waiting to be performed on some other block (for example, in the same or different die). If such operations are pending (for example, in the host command queue), in step 605, the erase operation may be suspended, the other pending operations performed in step 606, and the erase operation resumed in step 607 at Pulse 2 using the correct Pulse 2 parameters. Alternatively, in step 604, if it is determined that there is no other program or read operation with higher priority, the erase operation resumes in step 607. Consequently, a number erase pulses may be administered by repeating step 602 prior to a suspend-erase operation taking place.

In step 607, the erase operation is resumed. Prior to resuming the erase operation, controller 107 may determine Pulse 2 parameters based on values stored in one or more registers 106. In another aspect, controller 101 may determine (for example, calculate) the correct Pulse 2 parameters based on the saved erase parameters and program registers 106 before controller 107 makes its determination. In one example, referring briefly to FIG. 3, the negative value of the amplitude of Pulse 2, $V_{pulse2}$ 305, may be found as $$V_{pulse2} = -(V_{start} + \Delta V^* N_{erase}) \quad (1)$$

where $V_{start}$ 302 is the starting erase voltage, applied at Pulse 1 and $N_{erase}$ is the erase pulse number ($N_{erase}$ is set to 1 in the firmware after application of Pulse 1).

Controller 101 (or controller 107) may change the erase pulse parameters, $V_{pulse}$ and $T_{pulse}$ as functions of pulse number, $N_{pulse}$, or other SSD parameters, according to a predetermined set of rules (for example, based on parameters stored in registers 106, storage medium 102, or the like). Once the parameters are determined, the process is returned to step 602 using the new parameters. Likewise, if there are no higher priority operations pending as a result of the check performed in step 604, the process proceeds to step 607 and the erase operation resumed.

By allowing the erase procedure to be suspended after every pulse, the blocking time of the erase operation may be reduced from the total duration of the erase operation—for example, 2.5 to 10 ms—to the duration of the single erase pulse, $T_{pulse}$ (plus the time required for the verify operation, for example, about 200 μs). In this regard, the procedure of the subject technology $T_{pulse}$ may be set much smaller than if other technologies were used. For example, wherein $T_{pulse}$ may have been set at 0.5 to 1.0 ms, $T_{pulse}$ can be reduced by about 5 times to, for example, 100 to 200 μs, while incrementing the negative magnitude of the erase pulses only at every 5th erase pulse, instead of at every single pulse. This results in a blocking time of the erase operation below 0.5 ms. Reducing the blocking time of the erase operation may increase the number of IOPs for a given die, and, hence, increases the overall performance of the SSD.

Additionally or in the alternative, using an erase-suspend procedure of the subject technology, longer individual pulses with $T_{pulse}$ on the order of 2.5 to 10 ms may be applied instead of, for example, 0.5 to 1.0 ms pulses found in other technologies, while using smaller values of starting erase voltage, $V_{start}$, and voltage amplitude increment, $\Delta V$. Since the erase operation can be suspended after every pulse, this may result in an increase of the total erase time, while the blocking time of the erase operation, and, hence the SSD performance, remains unchanged. As described previously, using more erase pulses with smaller negative voltage amplitude and/or with longer pulse width reduces the wear-out/degradation of flash memory cells during cycling. Thus, the implementation of the subject technology may reduce the wear-out/degradation of the flash memory and to achieve higher endurance, that is, a higher number of P/E cycles the flash memory can undergo, while maintaining the same IOPs performance of the SSD.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

It is understood that the specific order or hierarchy of steps in the processes disclosed is an illustration of exemplary approaches. Based upon design preferences, it is understood that the specific order or hierarchy of steps in the processes may be rearranged. Some of the steps may be performed simultaneously. The accompanying method claims present elements of the various steps in a sample order, and are not meant to be limited to the specific order or hierarchy presented.

The previous description is provided to enable any person skilled in the art to practice the various aspects described herein. The previous description provides various examples of the subject technology, and the subject technology is not limited to these examples. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the invention.

The predicate words "configured to", "operable to", and "programmed to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

A phrase such as an "aspect" does not imply that such aspect is essential to the subject technology or that such aspect applies to all configurations of the subject technology. A disclosure relating to an aspect may apply to all configurations, or one or more configurations. An aspect may provide one or more examples. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples. A phrase such as an "embodiment" may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples. A phrase such as a "configuration" may refer to one or more configurations and vice versa.

The word "exemplary" is used herein to mean "serving as an example or illustration." Any aspect or design described herein as "exemplary" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A method for performing an erase operation in a flash memory device, the method comprising:
    initiating an erase operation on a group of memory cells, the erase operation including a plurality of erase pulses;
    after a predetermined number of erase pulses, determining if a subsequent operation is ready to be performed;
    suspending the erase operation if the subsequent operation is ready to be performed;
    performing the subsequent operation; and
    resuming the erase operation.

2. The method of claim 1, further comprising:
    determining the subsequent operation has a higher priority than the erase operation.

3. The method of claim 1, wherein the subsequent operation is performed on a different group of memory cells.

4. The method of claim 1, further comprising:
    setting the predetermined number of erase pulses to a maximum number of erase pulses to be performed by the erase operation before the erase operation is suspended.

5. The method of claim 4, wherein the maximum number of erase pulses is one.

6. The method of claim 1, further comprising:
    receiving an indication that the erase operation is not completed,
    wherein the erase operation is suspended upon receiving the indication that the erase operation is not completed.

7. The method of claim 1, further comprising:
    setting one or more parameters used to generate one or more of the plurality of erase pulses.

8. The method of claim 7, wherein the one or more parameters includes a starting pulse voltage.

9. The method of claim 7, wherein the one or more parameters includes an incremental adjustment in a pulse magnitude between subsequent pulses.

10. The method of claim 7, wherein the one or more parameters includes a pulse width.

11. The method of claim 1, further comprising:
    prior to resuming the erase operation, resetting one or more existing parameters used to generate one or more of the plurality of erase pulses based on one or more saved parameters.

12. A machine-readable storage media having instructions stored thereon that, when executed by a processor, perform a method for suspending an erase operation, the method comprising:
    providing to a flash memory circuit a first instruction to erase a group of memory cells using the erase operation;
    receiving a first indication that the erase operation is not completed if the group of memory cells has not been fully erased after a predetermined number of erase pulses has been performed;
    receiving a second indication that a subsequent operation has a priority above a predetermined threshold;
    suspending the erase operation in response to receiving the first indication and the second indication;
    performing the subsequent operation; and
    resuming the erase operation.

13. The machine-readable storage media of claim 12, wherein the predetermined threshold is the priority of the erase operation.

14. The machine-readable storage media of claim 12, the method further comprising providing to the flash memory circuit one or more parameters to use in generating one or more of the erase pulses to be used in the erase operation.

15. The machine-readable storage media of claim 12, the method further comprising:
    after suspending and prior to resuming the erase operation, providing to the flash memory circuit one or more parameters to use in generating one or more subsequent erase pulses initiated after resuming the erase operation.

16. The machine-readable storage media of claim 15, wherein the one or more parameters includes one or more of a starting pulse voltage, an amplitude increment, and a pulse width.

17. The machine-readable storage media of claim 15, wherein the erase operation is an incremental stepping pulse erase operation.

18. The machine-readable storage media of claim 12, wherein the resuming the erase operation comprises:
providing to the flash memory circuit a second instruction to continue erasing the group of memory cells.

19. A system, comprising:
a flash memory circuit, the flash memory circuit including one or more blocks of memory; and
a controller operably connected to the flash memory circuit, the controller operable to:
provide to the flash memory circuit an instruction to erase the block of memory cells using an erase operation;
receive a first indication that the erase operation is not completed if the block of memory cells has not been fully erased after a predetermined number of erase pulses;
receive a second indication that a subsequent operation is ready to be performed; and
on receiving the first indication and the second indication, suspend the erase operation, perform the subsequent operation, and resume the erase operation.

20. The system of claim 19, wherein the controller is further operable to:
determine the subsequent operation is associated with a priority level above a predetermined threshold.

* * * * *